United States Patent [19]

Giallorenzi

[11] Patent Number: 4,471,219

[45] Date of Patent: Sep. 11, 1984

[54] AMPLITUDE MODE MAGNETIC SENSORS

[75] Inventor: Thomas G. Giallorenzi, Springfield, Va.

[73] Assignee: The United States of America as represented by the Secretary of the Navy, Washington, D.C.

[21] Appl. No.: 355,952

[22] Filed: Mar. 8, 1982

[51] Int. Cl.³ .............................................. G02B 5/14
[52] U.S. Cl. ................................... 250/227; 324/244; 324/260; 250/231 R
[58] Field of Search ............... 250/227, 231 R, 231 P; 324/244, 260, 96; 350/96.20, 96.15

[56] References Cited

U.S. PATENT DOCUMENTS

| 4,147,979 | 4/1979 | Baues et al. | 324/244 |
| 4,368,430 | 1/1983 | Dale et al. | 324/244 |
| 4,371,838 | 2/1983 | Griscom | 324/244 |
| 4,376,248 | 3/1983 | Giallorenzi et al. | 250/227 |
| 4,414,471 | 11/1983 | Rines | 250/227 |

OTHER PUBLICATIONS

"Fiber Optic Sensor System Technology Assessment" by DSI, DSI-TR-80-001, Jan. 1, 1980.

Primary Examiner—David C. Nelms
Assistant Examiner—J. Brophy
Attorney, Agent, or Firm—Robert F. Beers; William T. Ellis

[57] ABSTRACT

A magnetic field sensor for detecting a magnetic field perturbation while nulling out variations in the signal caused by acoustic perturbations comprising a first and second optical fibers, an adjustable optical coupler for coupling light therebetween, a magnetic component attached to the optical coupler for exerting a mechanical force thereon proportional to a magnetic field perturbation to thereby change the degree of coupling between the fibers, and an optical detector for determining the amount of light actually being coupled between the fibers. As noted above, the system includes an acoustic circuit for nulling out the response in the detector signal due to acoustic perturbations. Two separate embodiments are disclosed. A first embodiment modulates the axial alignment of fibers in an end-to-end configuration by means of a magnetic material. A second embodiment modulates the evanescent coupling between the fibers disposed in parallel adjacency via a magnetostrictive material.

7 Claims, 3 Drawing Figures

AMPLITUDE MODE MAGNETIC SENSORS

BACKGROUND OF THE INVENTION

The present invention relates generally to devices for detecting very small magnetic fields, and more particularly, to devices for detecting such small magnetic fields by means of amplitude mode sensing.

Magnetic field sensors may be utilized in a variety of applications such as sensing the earth's magnetic field, in warfare sensing applications, and in Geophysical earth exploration. Of particular interest, is the applicability of these devices for use in anti-submarine or anti-ship warfare. Typically, the magnetic fields set up by the metallic structure of moving ships or submarines is quite small, on the order of $10^{-7}$ gauss.

The first optical fiber magnetic field sensor was recently demonstrated at the Naval Research Laboratory. (See the article "Optical Fiber Magnetic Field Sensors" by A. Dandridge, A. Tveten. G. Sigel, E. West and T. Giallorenzi, Electronics Letters, May 1980.) This optical fiber magnetic field sensor had a single mode fiber interferometer configuration. Although the use of an interferometer provides for extremely sensitive field sensing capabilities, the use of interferometric structure to measure induced phase shifts in the fiber leads to a complicated device structure which taxes the state of the art in optical componentry.

OBJECTS OF THE INVENTION

Accordingly, it is an object of the present invention to significantly simplify the device structure for a small magnetic field sensor.

It is a further object of the present invention to sense small magnetic fields by means of amplitude mode sensing.

Other objects, advantages, and novel features of the present invention will become apparent from the detailed description of the invention which follows the summary.

SUMMARY OF THE INVENTION

Briefly, the present invention comprises a magnetometer for sensing magnetic field perturbations including a first optical transmission line for propagating a light beam therethrough from an optical source;

a second optical transmission line;

a first adjustable optical coupler disposed to couple light propagating in the first transmission line to the second transmission line;

a magnetic material attached to the optical coupler for exerting a mechanical force thereon proportional to a magnetic field perturbation to thereby change the degree of optical coupling between the first and second optical transmission lines; and a first light detector for detecting the light coupled to the said second optical transmission line.

The magnetometer may also include an acoustic sensor with an acoustic response characteristic similar to the acoustic response of the first modulator, and a differencing circuit for subtracting this acoustic sensor signal from the light detector signal to thereby obtain a signal with the acoustic perturbation response nulled out.

In one embodiment, the optical coupler comprises a support for disposing the first and second transmission lines in end-to-end axial alignment in the absence of a magnetic field so that light propagated in the first transmission is directly transmitted to the second transmission line. One of these transmission line ends is fixed to the support while the other transmission line end is cantilevered from the support. The magnetic material comprises a magnetic coating disposed on the portion of the line adjacent this cantilevered end. A magnetic field perturbation will change the degree of optical alignment between the ends of the lines thereby changing the degree of light coupling between the lines. This change in coupling is then detected by the optical detector.

In a second embodiment, the transmission lines are realized by optical fibers with each fiber including a section thereof with the fiber core nearly exposed. The optical coupler comprises a support structure for holding the exposed core sections of the optical fibers in adjustable parallel adjacency so that evanescent coupling is achieved therebetween. The magnetic material comprises a portion of the support structure made of magnetostrictive material for exerting a mechanical force to change the separation between the exposed fiber core sections as a function of a magnetic field perturbation thereby changing the amount of light coupled between the fibers.

DETAILED DESCRIPTION OF THE EMBODIMENTS

Figure 1:
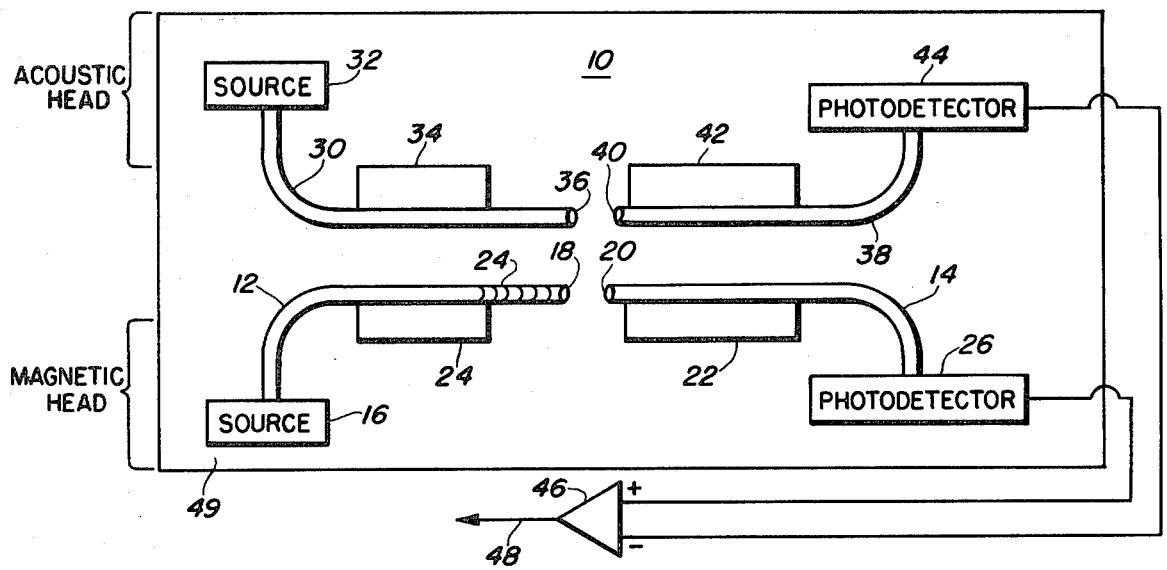
FIG. 1 is a schematic diagram setting forth one embodiment of the present invention.

As noted above, the present invention is directed to sensing a small magnetic field by modulating the light coupling between two optical transmission lines in accordance with the ambient magnetic field. This modulation is accomplished by disposing a magnetic material in relation to an optical coupler for exerting a mechanical force thereon proportional to the ambient magnetic field perturbation to thereby change the degree of optical coupling between the first and second optical transmission lines. Referring now to the drawings, wherein like referenced characters designate like or corresponding parts throughout the views, FIG. 1 shows a magnetic field sensor head 10 in accordance with the present invention. The first optical transmission line 12 is shown for propagating a light beam therethrough from an optical source 16. A second optical transmission line 14 is spatially disposed to obtain light from the transmission 12 and propagate this light to a photodetector 26. In this embodiment, the optical coupling between the first and second transmission lines 12 and 14 is obtained by disposing the ends 18 and 20 of these transmission lines in head to-head axial alignment such that light propagating through the first transmission line 12 will be directly transmitted to the second transmission line 14. This axial alignment is achieved by disposing the end 20 of the second optical transmission line 14 on a fixed support 22, while disposing the first transmission line 12 on a fixed support 24 such that the end section 18 of the transmission line 12 is cantilevered from the support 24. This cantilevered end 18 is coated with a magnetically sensitive coating 24. In the absence of a magnetic field perturbation, the end 18 of the transmission line 12 will be aligned axially with the end 20 of the second transmission line 14 therebey permitting maximum light coupling therebetween. However, when a magnetic field perturbation occurs perpendicular to the magnetically coated fiber, this perturbation will induce motion in the cantilevered magnetically coated end 18. Accordingly, this cantilevered end 18 will modulate the amount or amplitude of the light being coupled into the end 20 of the second transmission line 14. This modulated light will then be received and detected by the photodetector 26.

In FIG. 1, the optical transmission lines shown comprise optical fibers. However, it should be understood that the present magnetic field detection scheme is in no way limited to use only with optical fibers. Likewise, it should be understood that although FIG. 1 shows the optical transmission line 12 as having the cantilevered end with the magnetic coating 24 thereon, the end 20 of the second transmission line 14 could just as easily have been cantilevered with a magnetic coating and with the end 18 fixed to the support 24.

Depending on the environment in which this magnetic field sensor is to be located, it may frequently be desirable to cancel out non-magnetic field perturbations which may be present in the environment and which will affect the magnetic sensor. For example, a magnetic sensor trailed behind an aircraft would clearly require some form of circuitry for nulling or cancelling the response in the main magnetic field sensor due to acoustic vibrations and wind buffeting. Accordingly, a second sensor with the same acoustic sensing characteristics as the magnetic field sensor may be disposed in the magnetic field sensor head 10. This second sensor may be achieved by again disposing two optical transmission lines in head-to-head axial alignment with one of the ends catilevered. More specifically, a third optical transmission line 30 is shown for propagating light from an optical source 32. This third optical transmission line 30 is supported by a fixed support 34 such that one end 36 is cantilevered from the support by approximately the same amount as the end 18 in the first sensor is cantilevered from the support 24. A fourth optical transmission line 38 is disposed such that its end 40 is in head-to-head axial alignment with the end 36 such that light propagating through this third transmission line 30 will be directly transmitted to the fourth transmission line 38. This fourth transmission line 38 is supported by a fixed support 42 to achieve this head-to-head optical alignment. The signal propagating in this fourth optical transmission line 38 is detected by a photodetector 44. Accordingly, it can be seen that this second sensor head will not be sensitive to magnetic fields but will be sensitive to acoustic fields in an identical manner as the magnetic sensor head. Thus, it can be seen that by subtracting the output signal from the photodetector 44 which is proportional to the non-magnetic perturbation from the output signal from the photodetector 26 which is proportional to the magnetic field perturbation along with other acoustic perturbations in the environment, that a resultant signal will be obtained with the modulations from non-magnetic perturbations cancelled out. This subtraction operation can be simply accomplished by applying the signals from the photodetectors 26 and 44 to the positive and negative terminals of a differential amplifier 46. The output signal on line 48 from this differential amplifier 46 is thus proportional to the magnetic field perturbation perpendicular to the fibers with the acoustic field perturbation cancelled out. It should be understood of course that although the acoustic sensor head has been given a configuration identical to the magnetic sensor head, the acoustic sensor head is not limited to this configuration, but may take any configuration which will yield an acoustic sensitivity approximately identical to the acoustic sensitivity of the magnetic sensor head.

For very low frequency magnetic sensing, it is generally desirable to place the magnetic and acoustic sensor heads in a thermally insulating material 49 in order to further insulate the sensor heads from the environment. By way of example, materials with poor thermal conductivity which might be used include styrofoam, and fiberglass. As an alternative, the sensor heads could be disposed in a vacuum. It should be understood, of course, that the need for such a thermal shield such as a vacuum or thermally insulating material will depend on the frequency range to be detected. Such thermal shields may not be necessary at higher frequencies.

Figure 2:
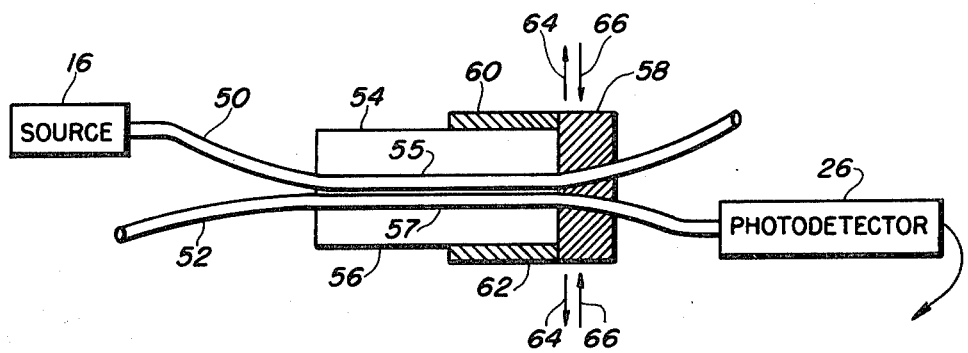
FIG. 2 is a schematic diagram of a coupler which may substituted for the coupler in FIG. 1.

FIG. 2 sets forth a second embodiment of the coupling mechanism which may be utilized in place of the cantilevered support system for achieving optical coupling. The coupling for this magnetic sensor head is based on evanescent field coupling. In essence, two optical transmission lines are disposed in adjustable parallel adjacency so that evanescent coupling is achieved therebetween. The support structure utilized for holding these transmission lines in adjustable parallel adjacency include a magnetic material component which will operate to change the separation between the exposed core sections as a function of any magnetic field perturbation present. This modulation of the separation between the transmission lines will result in the modulation of the light coupling between the lines. The configuration in FIG. 2 comprises a first and second optical transmission lines 50 and 52, formed from optical fibers. The optical fiber 50 is connected to couple light from the optical source 16 therethrough. The second optical fiber 52 is disposed in adjustable parallel adjacency with the first fiber 50 for a given length. In order to permit the desired evanescent field coupling between the fibers 50 and 52, both fibers are etched or polished to nearly expose the core area of those sections of the fibers to be held in adjustable parallel adjacency. Two support blocks 54 and 56 are grooved appropriately to hold the fibers 50 and 52, respectively, with the grooves in the blocks 54 and 56 parallel and facing each other such that the fibers disposed therein will be in adjustable parallel adjacency. One method for properly etching or polishing the fibers 50 and 52 would comprise cutting an appropriate groove in each block 54 and 56 such that the groove will have a depth so that the top of the fiber core will be slightly below the level of the face for the supports 54 and 56. The fibers may then be glued into grooves in the blocks 54 and 56 with a strong epoxy. Then, by simply polishing the fiber in the groove until it is level with the support face of the block, the fiber core will be nearly exposed. For a further discussion of this polishing technique, see the article entitled "Single Mode Fiber Optic Directional Coupler," by R. A. Bergh, G. Kotler, and H. J. Shaw, Electronics Letters 16, 260(1980). These two blocks 54 and 56 with their polished fiber sections 55 and 57 may then be placed in proximity such that the two polished fibers are in parallel adjacency for the proper interaction length L such that evanescent coupling is achieved. See the article "Acoustic Sensitivity of Single Mode Optical Power Dividers" by S. K. Sheem and J. H. Cole, Optics Letters, Vol. 4, No. 10, October 1979, pages 322–324. As is well known, the strength of the evanescent coupling is exponentially proportional to the separation between the fibers. Accordingly, by disposing a magnetostrictive material in relation to the support blocks 54 and 56, it is possible to increase or decrease the separation between the blocks and therefore the separation between the fibers in accordance with a magnetic field perturbation. More specifically, in one embodiment a magnetostrictive block 58 may be disposed at one end of the blocks 54 and 56 as shown in FIG. 2. Two arms 60 and 62 are in any convenient fashion attached to the magnetostrictive block 58 for exerting a force to squeeze the support blocks 54 and 56 together in accordance with the movement of the magnetostrictive block 58. The arm 60 is disposed above the block 54 while the arm 62 is disposed below the block 56. In the presence of a magnetic field perturbation, the magnetostrictive block 58 will experience a change in its dimensions. For example, the magnetic field perturbation may cause a change in the vertical dimension in accordance with the arrows 64, i.e., expansion, which will likewise move the arm 60 and 62 in the direction of the arrows 64 which will cause the blocks 54 and 56 to move apart slightly. Likewise, a dimensional change of the magnetostrictive material 58 in the direction 66, i.e.. contraction, will result in the arm 60 and 62 exerting a force to push the two support blocks 54 and 56 closer together. Thus, it can be seen that the change of dimension of the magnetostrictive block 58 in accordance with a magnetic field perturbation will act to change or modulate the separation between the support blocks 54 and 56, and thus the separation between the polished fiber sections 55 and 57. This separation modulation will modulate the coupling between the fibers as a function of the magnetic field perturbation. The amplitude variations caused by this coupling modulation may be measured by means of a photodetector 26.

Although the arm 60 and 62 are shown as being formed of magnetostrictive material, it should be understood that there is no requirement that these arms be made of magnetostrictive material. It should also be noted, that for convenience these arms 60 and 62 may be glued to the support blocks 54 and 56.

The block 58 may be formed from a variety of magnetic materials with magnetostrictive properties. These materials include both ferromagnetic materials such as iron, nickel, cobalt, and various alloys thereof, and ferrimagnetic materials such as, for example, various MET glasses.

Utilizing the above disclosed evanescent field coupler configuration, the amplitude variations therefrom may be utilized to give a measure of the applied magnetic field perturbation. However, again, the magnetic sensor head will be sensitive to a variety of field perturbations in addition to the magnetic field perturbation. Thus, it may be desirable to include a differencing scheme using a non-magnetic sensor head to cancel out acoustic vibrations in the same manner as shown in FIG. 1. This differencing scheme may be accomplished quite simply by substituting a second evanescent field coupler of the type shown in FIG. 2 in place of the head-to-head acoustic coupler head shown in FIG. 1. Of course, the blocks 58, 60, and 62 must be of non-magnetic material. Accordingly, this acoustic sensor head should have an approximately identical acoustic sensitivity characteristic as the magnetic sensor head with the magnetostrictive block 58. Thus, by subtracting the acoustically caused perturbation signals of the photodetector 44 from the perturbation signals from the photodetector 26 in the differential amplifier 46, a signal approximately proportional to the magnetic field perturbation will be obtained on line 48.

Again, it should be noted that this evanescent field coupler configuration may be disposed in a thermal shield depending on the frequencies of the field to be sensed.

Figure 3:
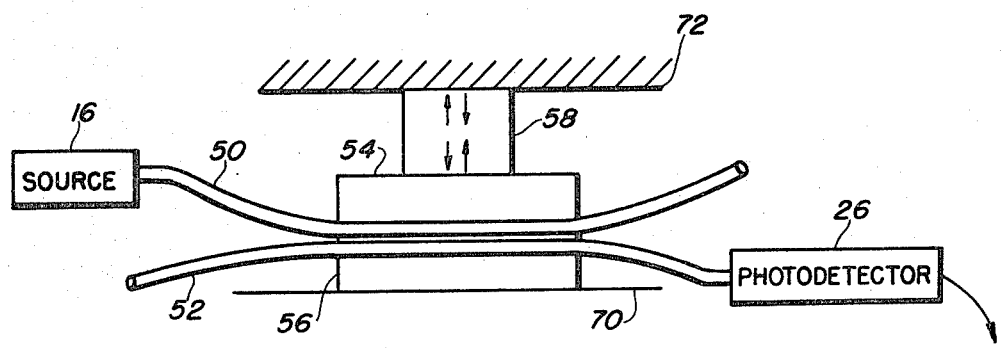
FIG. 3 is a schematic diagram of a third embodiment of the present invention.

It should also be noted that the use of the arm 60 and 62 attached to the ends of the magnetostrictive block 58 in order to form a pincer type action to transmit the exspansion and contraction of the magnetostrictive material comprises just one embodiment of the present evanescent field coupler. By way of example, the magnetostrictive block 58 could be disposed as shown in FIG. 3 such as it acts directly as a piston against the support blocks 54 and 56. In this type of configuration, the lower support block 56 would be disposed on a rigid surface 70 and the magnetostrictive block 58 would be disposed between a rigid surface 72 and the face of the support block 54 opposite to the groove. Accordingly, in the presence of a magnetic field perturbation, the expansion or contraction of the block 58 in the direction of one of the sets of arrows would act to modulate the separation between the nearly exposed fiber cores of the optical fibers 50 and 52.

The above disclosed magnetic field sensor yields a directly modulated signal output which is proportional to the applied field. The embodiments of this invention eliminate the need for a fiber interferometer and the device complications associated with those configurations. Additionally, the use of two sensor heads to cancel out acoustic perturbations permits a high level of environmental noise cancellation. Accordingly, the present invention discloses a simple room temperature optical device for detecting very small magnetic fields of less than the $-10^7$ gauss.

Obviously many modification and variations of the present invention are possible in light of the above teachings. It is therefore to be understood that within the scope of the appended claims the invention may be practiced otherwise than as specifically described.

What is claimed and desired to be secured by Letters Patent of the United States is:

1. A magnetic field sensor comprising:
   a first optical transmission line for propagating a light beam therethrough from a light source means;
   a second optical transmission line disposed in a given spatial relationship to said first optical transmission line to obtain light energy therefrom and propagate said light energy through said second optical transmission line;
   a first light detector connected to said second optical transmission line for detecting the intensity of the light propagating therethrough;
   a first modulator sensitive to a magnetic field perturbation for modulating the spatial relationship between said first and second optical transmission lines to thereby modulate the light intensity being obtained by said second optical transmission line from said first optical transmission line, said modulated light intensity detected by said first detector being proportional to the magnetic field perturbation;
   a third optical transmission line for propagating light therethrough from a light source means;
   a fourth optical transmission line disposed in the same spatial relationship to said third optical transmission line as said first optical transmission line is to said second optical transmission line;

a second modulator sensitive only to the non-magnetic perturbations which are sensed by said first modulator for modulating the spatial relationship between said third and fourth optical transmission lines to thereby modulate the light intensity being obtained by said fourth optical transmission line in accordance therewith, said modulated light intensity detected by said second detector being proportional to said non-magnetic perturbation; and a differencing circuit for subtracting the signal from said second detector which is proportional to said non-magnetic perturbation from the signal from said first detector signal which is proportional to said magnetic field perturbation to thereby obtain a signal with the modulations from non-magnetic perturbations cancelled out.

2. A magnetic field sensor as defined in claim 1, wherein said first modulator comprises:

first support means for disposing the ends of said first and second transmission lines in head-to-head axial alignment so that light propagating through said first transmission line is directly transmitted to said second transmission line;

wherein one of said first and second transmission line ends is fixed to said first support means while the other of said first and second transmission line ends is cantilevered from said first support means;

said transmission line with the cantilevered other end having a magnetic sensitive coating disposed on a portion thereof adjacent said other end so that motion may be induced in said cantilevered other end by a magnetic field perturbation thereby modulating the alignment and thus the amount of light transmitted between said first and second transmission lines in accordance therewith.

3. A magnetic sensor as defined in claim 2, wherein said second modulator comprises:

second support means for disposing the ends of said third and fourth transmission lines in head-to head axial alignment in the same manner as said first support means so that light propagating through said third transmission line is directly transmitted to said fourth transmission line;

wherein one of said third and fourth transmission line ends is fixed to said second support means while the other of said third and fourth transmission line ends is cantilevered from said second support means so that motion is induced therein by non-magnetic perturbations thereby modulating the alignment and thus the amount of light transmitted between said third and fourth transmission lines in accordance therewith.

4. A magnetic sensor as defined in claim 1, wherein said first and second transmission lines comprise optical fibers with each fiber including a section thereof with the fiber core nearly exposed; and wherein said first modulator comprises a first support structure for holding said exposed core sections of said optical fibers in parallel adjacency so that evanescent coupling is achieved therebetween, and a block formed from material with magnetostrictive properties for exerting a force against said first support structure to change the separation between said exposed core sections as a function of a magnetic field perturbation thereby modulating the light coupling between said fibers in accordance therewith.

5. A magnetic sensor so defined in claim 4, wherein said third and fourth transmission lines comprise optical fibers with each fiber including a section thereof with the fiber core nearly exposed; and wherein said second modulator comprises a second support structure for holding said exposed core sections of said third and fourth optical fibers in parallel adjacency so that evanescent coupling is achieved therebetween, said second support structure being responsive to non-magnetic perturbations in the same manner as said first support structure for changing the separation between said exposed core sections as a function said non-magnetic field perturbation thereby modulating the light coupling between said fibers in accordance therewith.

6. A magnetic sensor as defined in claim 4, wherein said first support structure comprises:

a first grooved block for holding the nearly exposed core section of said first optical transmission line fiber therein;

a second grooved block for holding the nearly exposed core section of said second optical transmission line therein in adjustable parallel adjacency with the groove disposed in said first block; and a first and second arms connected to opposite ends of said magnetostrictive block and disposed against the sides of said first and second blocks opposite from the grooves therein to form a pincer on said first and second blocks to thereby exert a force therein in accordance with the expansion and contraction dimension changes of said magnetostrictive block thereby modulating the evanescent coupling between said nearly exposed fiber cores.

7. A magnetic sensor head comprising:

a first optical transmission line for propagating a light beam therethrough from an optical source means:

a second optical transmission line:

a first adjustable optical coupler disposed to couple light propagating in said first transmission line to said second transmission line, said first optical coupler including a support for disposing the ends of said first and second transmission lines in head-to-head axial alignment in the absence of a magnetic field so that light propagating through said first transmission line is directly transmitted to said second transmission line;

wherein one of said first and second transmission line ends is fixed to said support while the other of said first and second transmission lines is cantilevered from said support;

a magnetically sensitive coating disposed on a portion of said other transmission line adjacent its cantilevered end so that a mechanical force will be exerted on said cantilevered other end by a magnetic field perturbation thereby changing the degree of optical alignment of and thus the amount of light transmitted between said first and second transmission lines;

a first light detector for detecting the light coupled to said second optical transmission line;

a third optical transmission line for propagating a light beam therethrough from an optical source means;

a fourth optical transmission line;

a second adjustable optical coupler disposed to couple light propagating in said third transmission line to said fourth transmission line with the same acoustic response characteristics as said first optical coupler;

a second optical detector for detecting the light coupled to said fourth transmission line; and a differencing circuit for subtracting the signal from said second detector from the signal from said first detector to thereby obtain a signal with the acoustic perturbation response cancelled out.

* * * * *